United States Patent [19]
Smith

[11] Patent Number: 5,763,896
[45] Date of Patent: Jun. 9, 1998

[54] REDUCED DARK CURRENT CATHODE STRUCTURES FOR INFRARED DETECTION

[75] Inventor: Arlynn Walter Smith, Blue Ridge, Va.

[73] Assignee: ITT Industries, Inc., White Plains, N.Y.

[21] Appl. No.: 794,624

[22] Filed: Feb. 3, 1997

[51] Int. Cl.$^6$ ............................................. H01L 29/06
[52] U.S. Cl. ...................... 257/14; 257/15; 257/21; 257/22
[58] Field of Search ..................... 257/14, 15, 21, 257/22, 184, 431

[56] References Cited

U.S. PATENT DOCUMENTS

| | | | |
|---|---|---|---|
| 5,477,060 | 12/1995 | Choi | 257/15 |
| 5,485,015 | 1/1996 | Choi | 257/21 |
| 5,539,206 | 7/1996 | Schimert | 257/21 |

*Primary Examiner*—Minh-Loan Tran
*Attorney, Agent, or Firm*—Plevy & Associates

[57] ABSTRACT

A separate absorption thermal conduction band infrared photocathode fabricated with an engineered material system having energy band gaps specifically selected to provide an energy barrier that is selectively tuned to the momentum and energy of the photogenerated carriers. Such a material system produces an infrared detector having a substantially reduced dark current.

20 Claims, 4 Drawing Sheets

REDUCED DARK CURRENT CATHODE STRUCTURES FOR INFRARED DETECTION

FIELD OF THE INVENTION

The present invention relates generally to infrared image detection and more particularly, to a bandgap engineered infrared photocathode fabricated with a material system that enables photogenerated carriers to be separated from background carriers based on the energy and momentum of the carriers.

Well known photocathode devices used in state of the art infrared detecting applications, employ bulk-narrow band gap semiconductor material systems such as Mercury Cadmium Tellurium, Indium Gallium Arsenide, Indium Gallium Arsenide Antimony, to absorb incoming radiation. The photogenerated electron hole pairs are then separated by an electric field and the resulting signal charge is sensed in some manner. Bulk detectors require cooling to minimize the dark current.

More recently, other devices based on bandgap engineering, known as quantum well infrared photocathodes (QWIPs), have been developed for detecting infrared energy. Unlike conventional photocathode devices, QWIPs are single carrier devices which do not generate electron hole pairs. More specifically, QWIPs are superlattice semiconductor devices which use multiple quantum wells with spacings adjusted to produce intersubband transitions within a conduction band when a ground state electron is promoted to an excited state upon absorbing an incoming photon having energy equal to the sub-band spacing. These intersub-band transitions are not natural to the materials, but arise due to quantum states coupling to create a band, bandgap engineering. The excited electron freely moves within the QWIP to form a photocurrent under electrical bias. As such, QWIP's are now used to detect infrared radiation and have been implemented in arrays to detect infrared images. An example of a QWIP is described in U.S. Pat. No. 5,539,206 entitled ENHANCED QUANTUM WELL INFRARED PHOTODETECTOR issued on Jul. 23, 1996 to Schimert.

Typical QWIPs are generally constructed as a stack of alternating semiconductor material layers sandwiched between two contact layers. A generally suitable semiconductor material system for fabricating QWIPs is Aluminum Gallium Arsenide/Gallium Arsenide. The semiconductor material layers are epitaxially grown on a lattice-matched transparent semiconductor substrate fabricated from Gallium Arsenide or the like. Each layer is grown to a thickness which is relatively thin in comparison to the relatively broad area each layer covers.

Since most QWIPs are based on mature Aluminum Gallium Arsenide/Gallium Arsenide material and processing technology, such QWIPs have desirable manufacturability and uniformity advantages which make them attractive from a manufacturing standpoint.

Some performance disadvantages exist, however, with present QWIP technology. A primary performance disadvantage concerns the requirement of a substantially high bias voltage for operation which results in the production of a large dark current (noise). In particular, the high bias voltage is needed in order to produce an allowed transition in the infrared portion of the energy spectrum. This allowed transition, however, leads to large dark currents which lower the sensitivity of the detector. Presently, the dark current problem is addressed by providing some form of cooling which enables QWIPs to perform efficiently by separating dark currents from photogenerated currents. One such current cooling method uses an energy filter directly after the quantum well structure to separate the dark currents from the photogenerated currents based on the energy of the carriers. An example of such a filter is an integrated electron transistor (IHET). An IHET operates under the assumption that the photogenerated electrons are slightly "hotter" than the background electrons (dark current) and thus, the energy barrier will preferentially allow the photogenerated electrons to pass. This preferential treatment reduces the dark current of the detector or allows the detector to be operated at a higher than normal temperature since the photocurrent and the dark current are separated.

One major disadvantage inherent in QWIPs which use IHET energy filters is that the IHET must be placed close to the photogeneration area, i.e., the quantum well structure, in order to capture the "hot" photogenerated electrons before they are cooled to the background temperature. This requirement limits the amount of semiconductor material which is used to detect the infrared radiation lowering the quantum efficiency of the detector. Another major disadvantage is that the IHET energy filter does not efficiently separate the hot photogenerated electrons from the background electrons allowing strong interactions between the carrier system, to exist. This again results in exchanges between the systems of photogenerated and background generated electrons which limits the amount of the absorbing material which can be used to detect infrared radiation. Accordingly, the quantum efficiency of the detector is substantially lowered.

Accordingly, there is a need for a QWIP or QWIP-like structure which produces an increased level of quantum efficiency via a substantial reduction in dark current.

SUMMARY OF THE INVENTION

A bandgap engineered infrared photocathode device comprising a plurality of well layers and a plurality of barrier layers disposed between the well layers to form a stack of alternating well and barrier layers. The stack of alternating well and barrier layers produce a signal charge which is indicative of the amount of infrared radiation sensed by the device. The well and barrier layers are fabricated from a semiconductor material system producing a material having first and second conduction bands separated by a predetermined amount of energy and momentum that enables photocarriers generated by the device to be separated from background carriers generated by the device based on the momentum and energy of the carriers, thereby substantially reducing the number of background-generated carriers in the signal charge produced by the device.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The infrared detector of the present invention substantially overcomes the dark current problem of current QWIPs and bulk infrared detectors by providing a band structure which uses two methods for separating the photogenerated carriers from the background carriers. As mentioned earlier, many current QWIP structures utilize IHET energy filters which separate photogenerated carriers from background carriers based on the energy of the different carrier only. The band structure of the present invention employs a device structure which separates the photogenerated carriers from the background carriers based on both the energy and the momentum of the different carriers. In this manner, the allowed transitions between the photogenerated carriers and the background carriers is weaker allowing larger photogeneration regions leading to larger quantum efficiency. Thus, a suitable choice of band gap engineering can be employed to substantially lower the dark current by using an energy barrier selectively tuned to the momentum and the energy of the photogenerated carriers.

Figure 1:
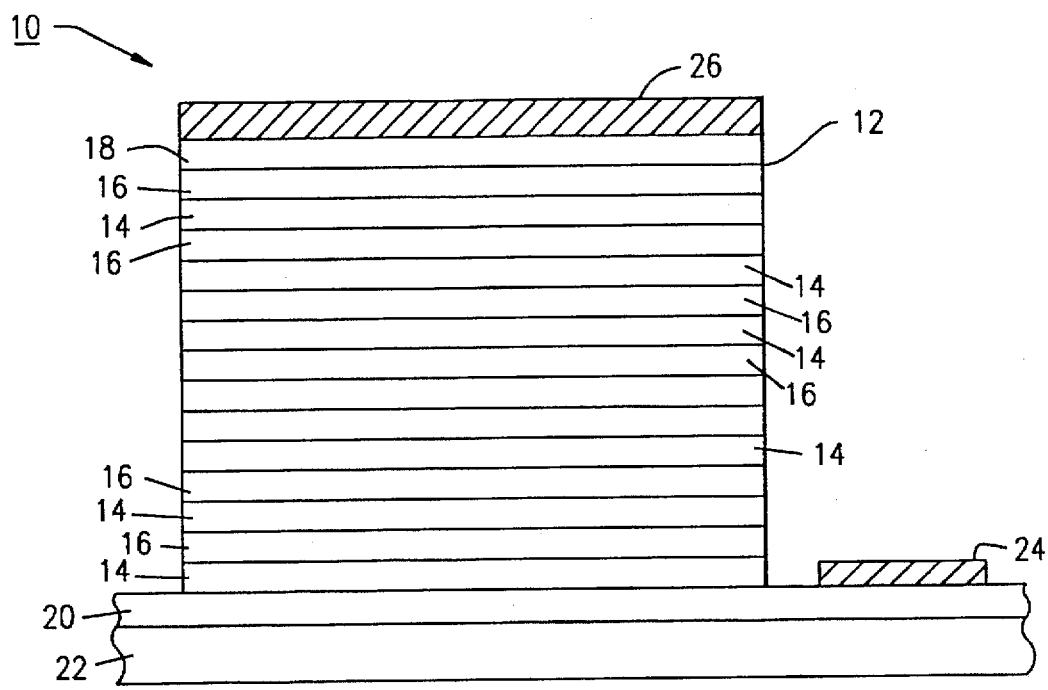
FIG. 1 is an enlarged schematic cross-sectional side view of an infrared detector employing the material system of the present invention.

The physical construction of a separate absorption thermal band IR detector 10 made in accordance with the present invention is schematically depicted in FIG. 1. The engineered structure 10 comprises a stack 12 of alternating semiconductor material barrier layer 14 and well layers 16 sandwiched between an upper contact layer 18 and a lower contact layer 20. The lower contact layer 20 is formed on a transparent substrate 22 and includes a first metal contact 24. The upper contact layer 18 includes a second metal contact 26.

Figure 2:
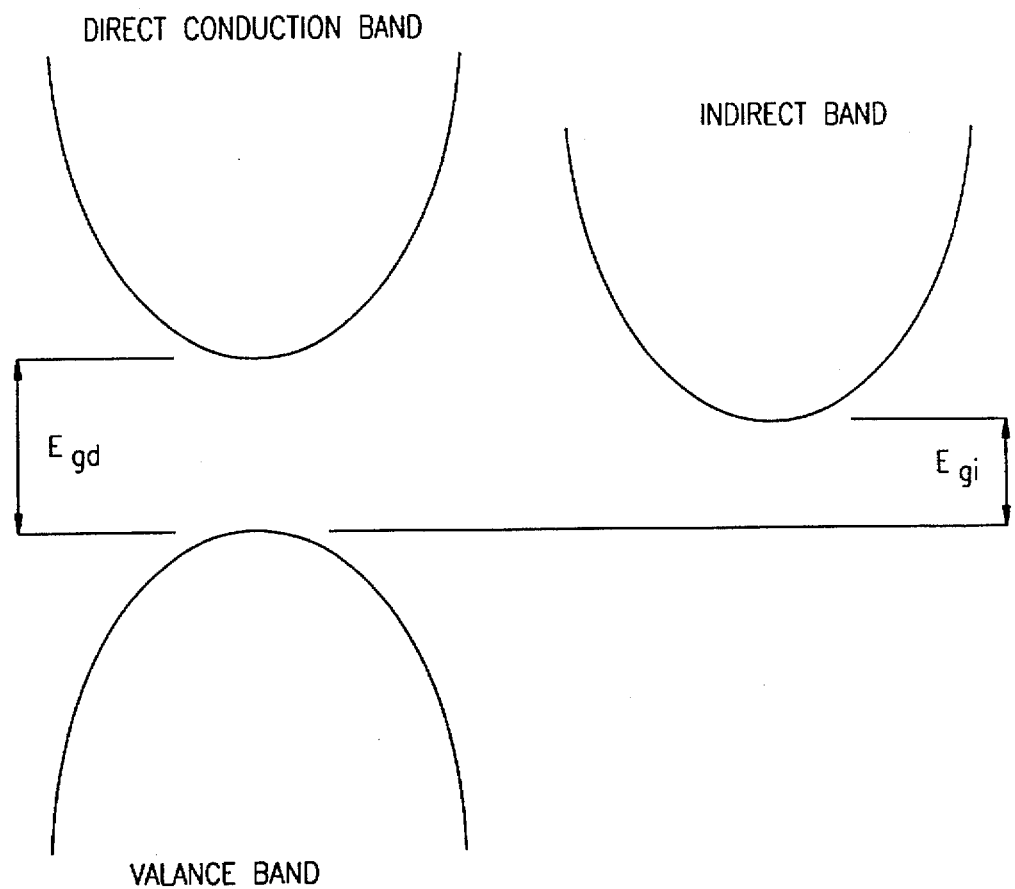
FIG. 2 is an energy band diagram illustrating an embodiment of the material system of the present invention.

Referring now to the energy band diagram of FIG. 2, the stack of alternating semiconductor material barrier and well layers results in an engineered material with first and second conduction bands separated by a small amount of energy. In a preferred embodiment, the first conduction band of the material, which is the higher of the two conduction bands, is a direct conduction band. The direct conduction band is selected to be slightly lower in energy than the desired energy to be detected and has the highest radiation absorption coefficient because it does not require a third particle, such as a phonon, to aid in the absorption of the radiation. Having an energy band gap slightly lower than the desired energy to be detected, allows the transition for electron hole pair generation. The second conduction band of the material structure is an indirect conduction band having a slightly lower energy level than the direct conduction band. An indirect conduction band has limited photogeneration capability compared with a direct conduction band. However, thermal currents are carried in indirect conduction bands due to the addition of phonon momentum. Since the indirect conduction band is smaller than the direct conduction band, the dark current is carried in the lower valley while the photogenerated current is carried in the direct upper valley. Accordingly, the dark current and the photogenerated current are separated by both energy and momentum. The allowed transitions between valleys is more limited than the simple interactions possible in systems of electrons separated only by energy in the same valley. This enables larger regions of photogenerating material to be used thereby increasing the quantum efficiency of the photocathode.

The separated system of carriers may then be filtered by single conduction band bulk IHET structure 30 (FIG. 3) before any other means of lowering the dark current is employed. The IHET 30 only limits the contribution of the lower band because of the difference in the energy and momentum between the first and second conduction bands.

Figure 3:
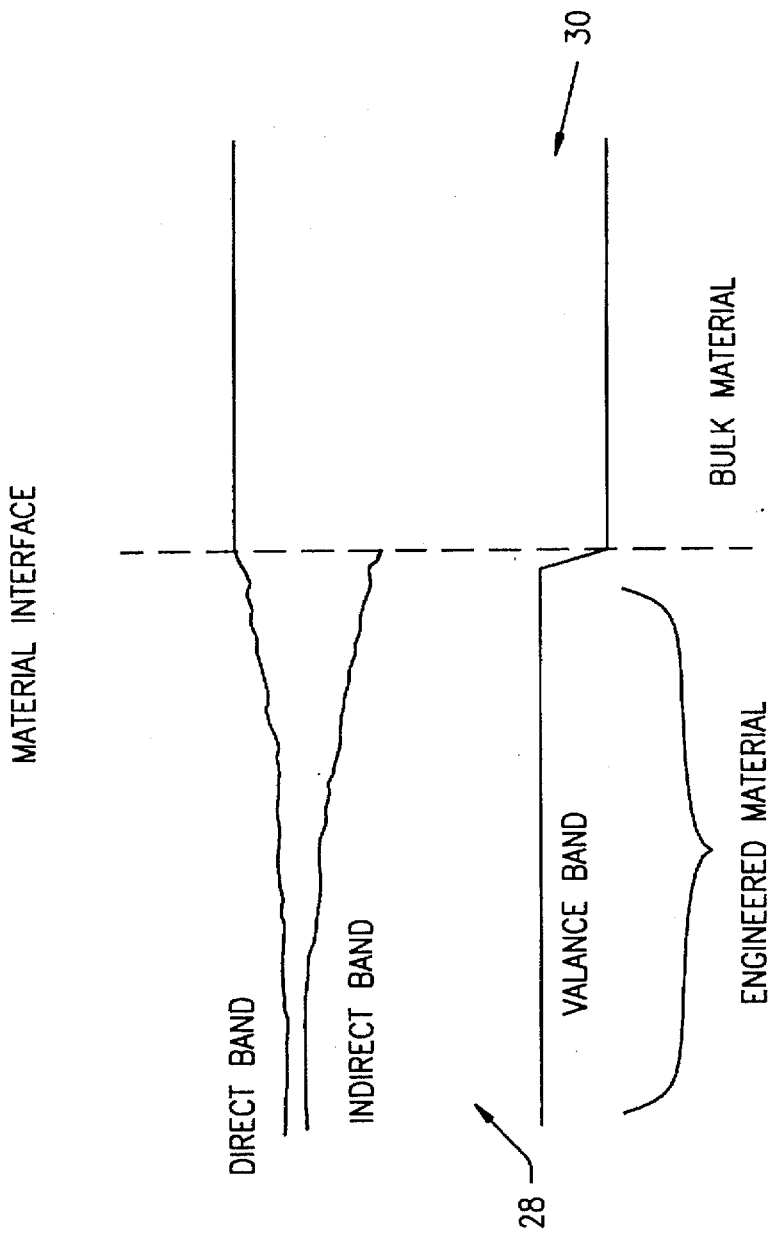
FIG. 3 is a spatial energy band diagram illustrating the device configuration of the material system of the present invention with a dark current separator.

FIG. 3 illustrates the energy band diagram of a two material system which results in a substantial decrease in dark current. The device structure comprises a first layer of engineered material 28 having a two band system comprising a direct conduction band with a band gap that widens with respect to an indirect conduction band. At a given suitable energy level, a second material 30 with a single direct conduction band with an energy equal to the direct conduction band of the two band system is introduced. This allows the photogenerated carriers generated in the first material to flow into the wider band gap of the second material. The dark current in the lower valley is preferentially screened and is forced to flow laterally to collecting contacts. The amount of separation of the indirect to direct conduction bands of the first material at the first and second material interface leads to the reduction in dark current by several orders of magnitude.

An example of a material system producing a plurality of bands is an iron-nickel-copper-sulfur (Fe-Ni-Cu-S) system. Nickel sulfide ($NiS_2$) has an indirect bandgap of 0.3 eV, iron sulfide ($FeS_2$) in the Macrasite form, has a direct band gap of approximately 0.47 eV, and copper sulfide ($CuS_2$) has a direct bandgap of approximately 1 eV. Mixing the system will produce the desired band structure.

Figure 4:
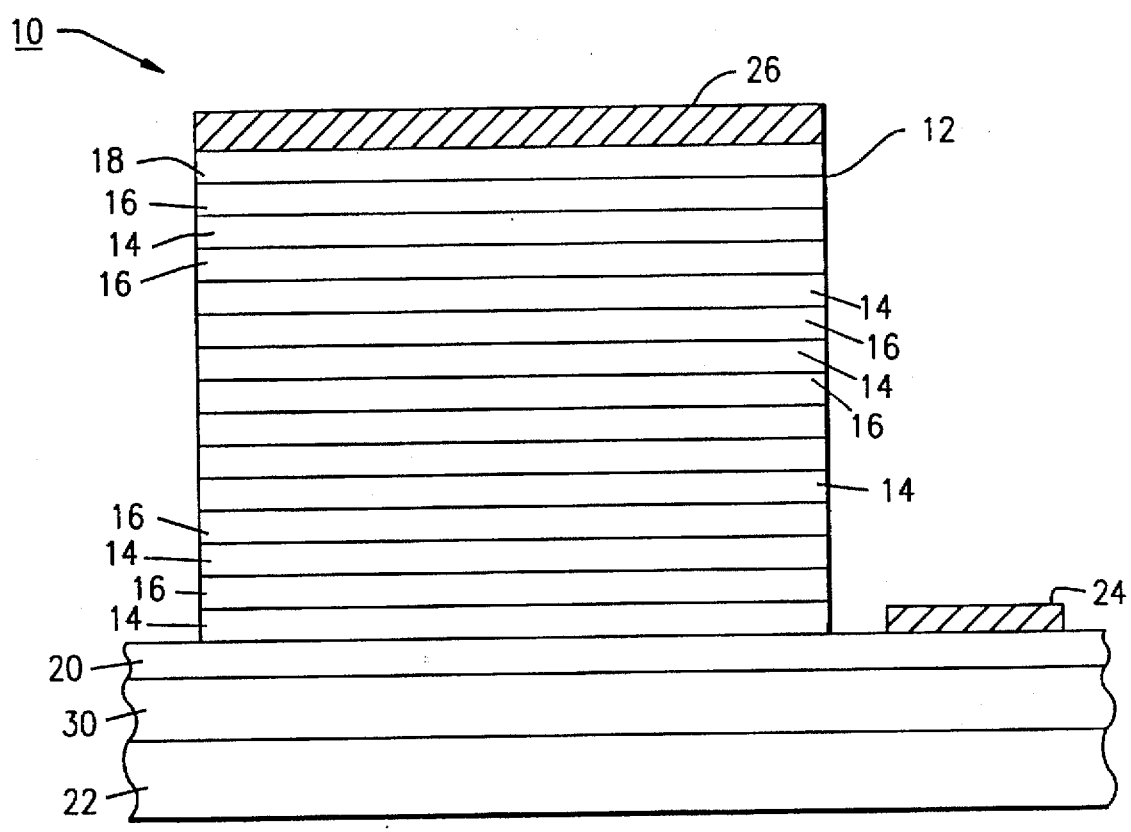
FIG. 4 is an enlarged schematic cross-sectional side view of the infrared detector of FIG. 1 with an optional IHET to separate the signal and the dark current.

FIG. 4 shows an embodiment of the separate absorption thermal band IF detector with the IHET filter 30 attached. A third unbiased contact is required to drain off the thermal currents from the indirect band of the engineered material layer.

It will be understood that the embodiment described herein is merely exemplary and that a person skilled in the art may make many variations and modifications to the described embodiment utilizing functionally equivalent elements to those described. Any variations or modifications to the invention described hereinabove are intended to be included within the scope of the invention as defined by the appended claims.

What is claimed is:

1. A separate absorption thermal conduction band infrared photocathode device comprising:

a plurality of well layers; and a plurality of barrier layers disposed between said well layers to form a stack of alternating well and barrier layers which produce a signal charge which is indicative of the amount of infrared radiation sensed by said device;

wherein said well and barrier layers are fabricated from a semiconductor material system producing an engineered material having first and second conduction bands separated by a predetermined amount of energy that enables photocarriers generated by said device to be separated from background carriers generated by said device based on the momentum and energy of said carriers, thereby substantially reducing the number of background-generated carriers in the signal charge produced by said device.

2. The separate absorption thermal conduction band infrared photocathode device according to claim 1, wherein said first conduction band has an energy level which is slightly higher than said second conduction band.

3. The separate absorption thermal conduction band infrared photocathode device according to claim 2, wherein said first conduction band comprises a direct conduction band having an energy level which is slightly lower than the energy to be detected.

4. The separate absorption thermal conduction band infrared photocathode device according to claim 2, wherein said second conduction band comprises an indirect conduction band.

5. The separate absorption thermal conduction band infrared photocathode device according to claim 1, wherein said semiconductor material system includes a second material having a direct conduction band.

6. The separate absorption thermal conduction band infrared photocathode device according to claim 5, wherein said first conduction band comprises a direct conduction band, said direct conduction band of said second material having an energy level substantially equal to said direct conduction band of said first material so that said photo-carriers flow into said second material.

7. The separate absorption thermal conduction band infrared photocathode device according to claim 1, further comprising energy filtering means for separating any remaining background carriers from said photo carriers.

8. The separate absorption thermal conduction band infrared photocathode device according to claim 7, wherein said energy filtering means comprises an integrated hot electron transistor.

9. The separate absorption thermal conduction band infrared photocathode device according to claim 1, further comprising a substrate which supports said stack of alternating well and barrier layers.

10. The separate absorption thermal conduction band infrared photocathode device according to claim 1, further comprising an upper contact layer and a lower contact layer, said stack of alternating well and barrier layers disposed between said upper and lower contact layers.

11. The separate absorption thermal conduction band infrared photocathode device according to claim 10, further comprising a substrate for supporting said stack and said upper and lower contact layers, said lower contact layer disposed on said substrate.

12. The separate absorption thermal conduction band infrared photocathode device according to claim 11, fixer comprising a first metal contact disposed on said upper contact layer and a second metal contact disposed on said lower contact layer.

13. A quantum well infrared photocathode device comprising: a plurality of well layers; a plurality of barrier layers disposed between said well layers to form a stack of alternating well and barrier layers which produce a signal charge which is indicative of the amount of infrared radiation sensed by said device; and a transparent substrate supporting said stack of alternating well and barrier layers;

wherein said well and barrier layers are fabricated from a semiconductor material system producing first and second conduction bands separated by a predetermined amount of energy that enables photocarriers generated by said device to be separated from background carriers generated by said device based on the momentum and energy of said carriers, thereby substantially reducing the number of background-generated carriers in the signal charge produced by said device.

14. The separate absorption thermal conduction band infrared photocathode device according to claim 13, further comprising an upper contact layer and a lower contact layer, said stack of alternating well and barrier layers disposed between said upper and lower contact layers, wherein said lower contact layer is disposed on said substrate.

15. The separate absorption thermal conduction band infrared photocathode device according to claim 13, further comprising a first metal contact disposed on said upper contact layer and a second metal contact disposed on said lower contact layer.

16. The separate absorption thermal conduction band infrared photocathode device according to claim 13, wherein said first conduction band has an energy level which is slightly higher than said second conduction band.

17. The separate absorption thermal conduction band infrared photocathode device according to claim 16, wherein said first conduction band comprises a direct conduction band having an energy level which is slight lower than the energy to be detected.

18. The separate absorption thermal conduction band infrared photocathode device according to claim 16, wherein said second conduction band includes an indirect conduction band.

19. The separate absorption thermal conduction band infrared photocathode device according to claim 13, wherein said semiconductor material system includes a second material having a direct conduction band and said first conduction band comprises a direct conduction band, said direct conduction band of said second material having an energy level substantially equal to said direct conduction band of said first material so that said photo-carriers flow into said second material.

20. The separate absorption thermal conduction band infrared photocathode device according to claim 13, further comprising an integrated hot electron transistor filtering any remaining background carriers from said photo carriers.

* * * * *